(12) United States Patent
Stocker et al.

(10) Patent No.: US 7,859,169 B2
(45) Date of Patent: Dec. 28, 2010

(54) SPRING ELEMENT FOR PRETENSIONING A PIEZOELECTRIC ACTUATOR AND PIEZOELECTRIC ACTUATOR WITH THE SPRING ELEMENT

(75) Inventors: Werner Stocker, St. Peter Freien (AT); Franz Veronik, Stainz (AT); Andreas Jakope, Ehrenhausen (AT); Manfred Reinisch, Gr. St. Florian (AT)

(73) Assignee: EPCOS AG, Munich (DE)

( * ) Notice: Subject to any disclaimer, the term of this patent is extended or adjusted under 35 U.S.C. 154(b) by 0 days.

(21) Appl. No.: 12/361,312

(22) Filed: Jan. 28, 2009

(65) Prior Publication Data
US 2009/0212666 A1     Aug. 27, 2009

Related U.S. Application Data

(63) Continuation of application No. PCT/DE2007/001324, filed on Jul. 26, 2007.

(30) Foreign Application Priority Data
Jul. 28, 2006     (DE) ........................ 10 2006 035 038

(51) Int. Cl.
*H01L 41/08* (2006.01)
(52) U.S. Cl. ...................... 310/328; 310/348
(58) Field of Classification Search ................. 310/328, 310/348, 355
See application file for complete search history.

(56) References Cited

U.S. PATENT DOCUMENTS

| | | | | |
|---|---|---|---|---|
| 4,850,450 A * | 7/1989 | Hoyle et al. | ................. | 181/102 |
| 5,062,619 A | 11/1991 | Sato | | |
| 5,557,974 A * | 9/1996 | Hase et al. | ............. | 73/862.335 |
| 6,059,163 A | 5/2000 | Pfister et al. | | |
| 6,135,234 A * | 10/2000 | Harris et al. | ................. | 181/106 |
| 6,274,967 B1 * | 8/2001 | Zumstrull et al. | ........... | 310/328 |
| 6,411,018 B1 | 6/2002 | Heinz | | |
| 6,494,288 B1 * | 12/2002 | Tashiro et al. | ............... | 181/102 |
| 6,588,267 B1 * | 7/2003 | Bradley | ................... | 73/152.47 |
| 6,944,929 B2 * | 9/2005 | Ogawa et al. | .................. | 29/458 |
| 6,984,924 B1 | 1/2006 | Voigt et al. | | |
| 6,998,761 B1 * | 2/2006 | Frank et al. | .................. | 310/328 |
| 7,145,282 B2 * | 12/2006 | Oakley et al. | ............... | 310/344 |
| 7,175,112 B2 * | 2/2007 | Uhlmann | .................. | 239/533.9 |
| 7,222,424 B2 | 5/2007 | Jovovic et al. | | |
| 7,339,308 B2 | 3/2008 | Boecking et al. | | |
| 7,420,316 B2 * | 9/2008 | Kienzler et al. | ............. | 310/311 |
| 2003/0034594 A1 | 2/2003 | Schmieder et al. | | |
| 2004/0195060 A1 | 10/2004 | Jovovic et al. | | |

FOREIGN PATENT DOCUMENTS

| | | |
|---|---|---|
| DE | 693338 | 7/1940 |
| DE | 198 54 508 C1 | 5/2000 |
| DE | 199 28 189 A1 | 4/2001 |
| DE | 101 40 196 A1 | 3/2003 |
| DE | 101 40 197 A1 | 3/2003 |

(Continued)

*Primary Examiner*—J. SanMartin
(74) *Attorney, Agent, or Firm*—Slater & Matsil, L.L.P.

(57) ABSTRACT

A spring element for pretensioning a piezoelectric actuator is specified, wherein the spring element has a tubular body with recesses. The recesses are each made in the form of a polygon with rounded corners. A piezoelectric actuator with such a spring element is also specified.

18 Claims, 2 Drawing Sheets

FOREIGN PATENT DOCUMENTS

| | | |
|---|---|---|
| DE | 101 49 746 C1 | 5/2003 |
| DE | 103 19 601 A1 | 11/2004 |
| DE | 103 21 695 A1 | 12/2004 |
| DE | 10 2004 031 597 A1 | 2/2006 |
| EP | 0 881 042 B1 | 12/1998 |
| EP | 1 021 662 B1 | 7/2000 |
| FR | 2404770 A2 | 4/1979 |
| GB | 482306 | 3/1938 |
| WO | WO 03/033933 A1 | 4/2003 |
| WO | WO 2005/062395 A1 | 7/2005 |

\* cited by examiner

SPRING ELEMENT FOR PRETENSIONING A PIEZOELECTRIC ACTUATOR AND PIEZOELECTRIC ACTUATOR WITH THE SPRING ELEMENT

This application is a continuation of co-pending International Application No. PCT/DE2007/001324, filed Jul. 26, 2007, which designated the United States and was not published in English, and which claims priority to German Application No. 10 2006 035 038.3 filed Jul. 28, 2006, both of which applications are incorporated herein by reference.

TECHNICAL FIELD

A spring element for use with a piezoelectric actuator is described.

BACKGROUND

A piezoelectric actuator with a tubular spring element provided with recesses is known from WO 2005/062395.

A piezoelectric actuator with a tubular spring element provided with recesses is also known from U.S. Publication 2003/034594 A1.

SUMMARY

Embodiments of the invention provide a pretensioning element or a piezoelectric actuator with a pretensioning element that can be used flawlessly for a long time.

A spring element for pretensioning a piezoelectric actuator that includes a tubular body is specified. The body has recesses with rounded corners. The outline of each recess then can have corners that are exclusively rounded.

Preferably, the tubular body is made with recesses that are in the form of a polygon, where the corners of the polygon are rounded. The recesses can in this case have a continuous uninterrupted outline. In particular, it is preferred that the recesses each be designed in the form of a rhombus with rounded corners.

The spring element can put a piezoelectric multilayer element of a piezoelectric actuator under pressure tensioning, by having, for example, a lower height than the multilayer element and being bonded mechanically to the face of the multilayer element directly or indirectly, for example, via a bearing support.

Polygonal, in particular, rhombic recesses that have rounded corners have the advantage that, in spite of the interrupted structure of the tubular body due to the recesses, mechanical stresses that are hazardous for its structural integrity cannot develop if it is subjected to mechanical stresses. For example, it turned out that a tubular body for pretensioning a piezoelectric actuator that is provided with recesses that have sharp edges or corners can form cracks under mechanical stress.

In addition, recesses with rounded corners have the advantage that the cutting device of a stamping tool used to stamp out the recesses has to be ground or sharpened less often. Specifically, it turned out that recesses with rounded corners can be stamped out well even if the cutting device or blade of a stamping tool has already become dulled. The waiting expenditure and the waiting costs for the stamping tool therefore can be advantageously reduced.

Recesses with rounded corners also have an advantage when the tubular body stretches, contracts and, in doing so, folds or bends. Specifically, it was observed and established that when a tubular body with rhombic recesses is bent, the outer contour of the tubular body changes little at the bending point. Recesses with other shapes, whose corners are not rounded, under these circumstances led to an outer contour that was considerably different from a circle. This had a negative effect on the mechanical stability of the tubular body.

According to a preferred embodiment of the spring element, the recesses form a regular pattern. This gives the advantage that the distribution of mechanical stress through the tubular body is particularly uniform, and that larger mechanical stress points under mechanical load are not to be expected. The recesses can be arranged in rows, where each recess of a first row matches the recess of the second row over in the projection along the length of the tube axis. This results in a lattice pattern of recesses, which is particularly favorable with regard to mechanical stability, especially elasticity.

Possible embodiments of the spring element include a tubular body with an outer contour in the form of a regular polygon. The outer contour is the shape of the tubular body that is seen when the tubular body is looked at in top view or when the cross section running orthogonal to the lengthwise axis of the tubular body is observed.

It turned out that a hexagonal outer contour is particularly favorable with regard to the mechanical stability of the tubular body. Octagonal outer contours also turned out to be favorable.

The tubular body can also have an outer contour with a continuously curved shape. In this case, a circular structure, or a corrugated or flattened circular structure, are possibilities for the outer contour.

The tubular body can have a varying thickness. Where the tubular body is thinner than in other regions of the body, it could, for example, fold or bend more easily under mechanical stress. This lets the region of the tubular body that has the greatest tendency to fold or bend be narrowed down or defined. The tubular body in this region could intentionally be provided with a higher number, or a smaller number, of recesses in the form of rhombi with rounded corners in order to establish the desired bending property or stability there.

The tubular body preferably contains materials that give it a long-term stable elasticity, but at the same time, a stiffness that is sufficient for pretensioning a piezoelectric multilayer element. Springy materials, in particular, can be used. Metals or metal alloys are preferred. Especially preferred are steel or steel alloys, as well as nonferrous metals. However, plastics could also be used.

Also specified is a piezoelectric actuator that has a piezoelectric multilayer element with a number of stacked piezoelectric layers and electrode layers. In this case, the piezoelectric layers preferably contain a piezoelectric ceramic, for example, a PZT ceramic. The piezoelectric actuator, moreover, has a spring element in accordance with embodiments of the invention, where the piezoelectric multilayer element is arranged at least partially within the spring element.

The piezoelectric multilayer element can be created by stacking ceramic green films, which are provided with electrode layers, and then sintering them. In doing so, preferably, a monolithic multilayer element is created.

The spring element is made and mechanically bonded to the piezoelectric multilayer element so that the piezoelectric multilayer element can be put under tensioning by pressure.

According to one embodiment of the piezoelectric actuator, the spring element is mechanically bonded to a bearing support at both of its face sides or end sides. The bearing support is preferably bonded to one face surface of the electric multilayer element and clamps it together with the spring element. For example, the spring element is soldered to at least one of the bearing supports. The bearing support could, for example, be made as a cap.

The electrode layers of the piezoelectric multilayer element can each be connected to an electric connector element. An electric connector element can be brought out through at least one of the bearing supports, which is advantageous as a space-saving mode of construction.

An electric connection element in this case could comprise an electric lead of the piezoelectric actuator. The lead could also be designed as a connecting wire, cable or lug.

According to one embodiment of the piezoelectric actuator, an electric connecting element comprises a contacting layer that is connected to the electrode layers and applied to the surface of the piezoelectric multilayer element.

BRIEF DESCRIPTION OF THE DRAWINGS

The described embodiments are explained in more detail by means of the following figures. Here.

Figure 1:
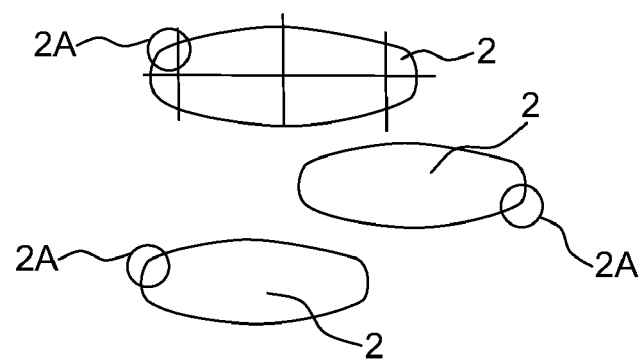
FIG. 1 shows a spring element with rhombic recesses.

The following list of reference numbers can be used in conjunction with the drawings:

P Piezoelectric actuator
1 Tubular pretensioning element
2 Rhombic recess with rounded corners
2a Rounded corner
3 Piezoelectric multilayer element
4 Bearing support
5 Spot weld

DETAILED DESCRIPTION

FIG. 1 shows rhombic shapes 2 with rounded corners, which are used as recesses in a tubular spring for pretensioning a piezoelectric actuator. However, triangular shapes, square shapes or other polygons 2 with rounded edges could, for example, be used as recesses in the tubular spring.

Figure 2:
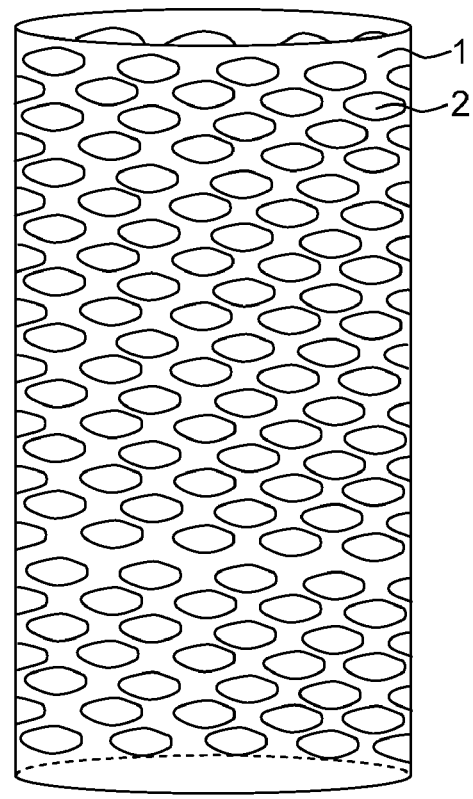
FIG. 2 shows a piezoelectric actuator with a spring element that has rhombic recesses.

FIG. 2 shows a tubular spring 1, in which a plurality of rhombic recesses 2 are made in a regular pattern. The recesses could be made by stamping or by means of a stamping tool.

The recesses 2, in FIGS. 1 and 2, are rhombic with rounded corners 2a. Recesses 2 made in this way have the advantage that notch effects between or at the recesses can be avoided. A notch effect is characterized by mechanical stresses that could lead to material failure developing at sharp-edged or sharp-cornered regions of the material. However, since the proposed recesses do not have sharp edges in their circumference, this means that the structure of the tubular spring 1 likewise does not have sharp edges beside or along each recess 2. With that, mechanical stresses that are dangerous to the structural integrity of the tubular spring do not arise or are at least considerably reduced.

The material of the tubular spring 1 between the recesses 2 acts as a bending carrier, due to which the stiffness of the spring is greatly reduced compared to a pretensioning element for a piezoelectric actuator without recesses. A bending carrier is a carrier or a carrier material that can bend or deform without being destroyed.

Because of the recesses that are less susceptible to notch effects, the long-term strength of the tubular spring moreover can be increased, since the probability of microcracks developing is reduced.

Since the rhombic recesses do not have sharp corners or edges, the punching tool that punches them out of a spring element has to be sharpened less often. The running time of the punch tool can thus be advantageously increased.

The rhombic recesses also have the advantage that they enable smaller mechanical stress points within the tubular spring, which otherwise could arise if the tubular spring had sharp-cornered or sharp-edged regions.

It also turned out that rhombic recesses lead to lower variations of the concentricity of the outer contour of a hollow cylindrical tubular spring when the tubular spring bends or is compressed or expands.

Figure 3:
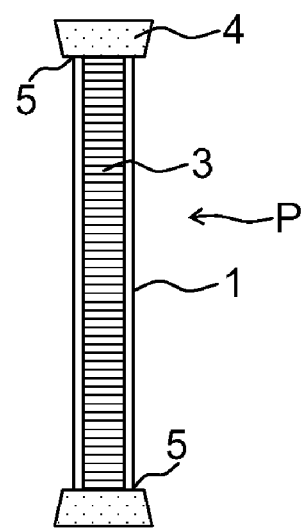
FIG. 3 shows a piezoelectric actuator.

FIG. 3 shows a piezoelectric actuator P with a piezoelectric multilayer element 3 and a tubular spring 1 formed around the element. The tubular spring is mechanically bonded to a bearing support 4 at each of its end faces by means of welding or spot welding 5. Moreover, the tubular spring is made to be slightly shorter than the piezoelectric element 3. The bearing supports are shown schematically here. They could, however, have through-passages or hollow spaces for additional elements of the piezoelectric actuator, or could be mechanically linked to them, for example, like electric connecting elements, or a mechanism, for example, a deflection mechanism for actuation of a valve. The valve could be a component of an injection device, in particular a fuel-injection device.

Although both end faces of the tubular body 1 can be bonded to a bearing support 4, it is possible to bend at least one end face of the tubular body around so that an end face of the piezoelectric multilayer element 3 is at least partially covered by an end region of the tubular body. In this way, the other end of the tubular body could be provided with a bearing support, where this end of the tubular body preferably does not extend entirely up to the bearing support. Connection of the two components could provide the required pretensioning, for example, by welding the piezoelectric multilayer element 3.

Figure 4A:
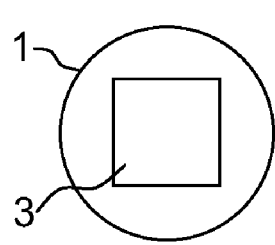
FIGS. 4A, 4B, and 4C show the cross sections of variously-shaped spring elements.
Figure 4B:
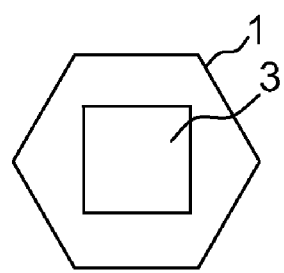
Figure 4C:
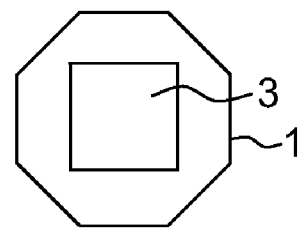

FIG. 4 shows, in a top view, different embodiments a, b and c of the outer contour of the tubular body 1, in which a piezoelectric multilayer element 3 has been inserted. Circular, hexagonal and octagonal outer contours are shown.

What is claimed is:

1. A spring element for pretensioning a piezoelectric actuator, comprising a tubular body that has a plurality of recesses, wherein each recess has a shape in the form of a rhombus with rounded corners.

2. The spring element as in claim 1, wherein each and every corner of each recess is rounded.

3. The spring element as in claim 1, wherein the recesses are arranged in a regular pattern.

4. The spring element as in claim 3, wherein the recesses are arranged in rows, wherein each recess of a first row matches to a recess of a second row in the projection along the tubular axis.

5. The spring element as in claim 1, wherein the tubular body has an outer contour in the form of a regular polygon.

6. The spring element as in claim 1, wherein the tubular body has an outer contour with a continuously curved shape.

7. The spring element as in claim 1, wherein the tubular body is seamless.

8. The spring element as in claim 1, wherein the tubular body has a varying thickness.

9. The spring element as in claim 8, wherein the tubular body is profiled.

10. A piezoelectric actuator comprising:
a piezoelectric multilayer component with a plurality of stacked piezoelectric layers and electrode layers, and a spring element comprising a tubular body with a plurality of recesses, each recess having a shape in the form of a rhombus with rounded corners, wherein the piezoelectric multilayer element is arranged at least partially within the spring element.

11. The piezoelectric actuator as in claim 10, wherein the spring element puts the piezoelectric multilayer element under pressure tensioning.

12. The piezoelectric actuator as in claim 10, wherein the spring element is bonded at end sides with a bearing support that clamps the electric multilayer element at upper and lower sides.

13. The piezoelectric actuator as in claim 12, wherein the spring element is welded to the bearing support.

14. The piezoelectric actuator as in claim 10, wherein each electrode layer is connected to an electric connecting element.

15. The piezoelectric actuator as in claim 14, wherein at least one of the electric connecting elements is brought out through at least one of the bearing supports.

16. The piezoelectric actuator as in claim 14, wherein at least one of the electric connecting elements comprises an electric lead of the piezoelectric actuator.

17. The piezoelectric actuator as in claim 14, wherein the at least one of the electric connecting elements comprises a contacting layer that is applied to a surface of the piezoelectric multilayer element and is connected to the electrode layers.

18. The piezoelectric actuator as in claim 10, wherein the recesses are arranged in a regular pattern.

* * * * *